United States Patent [19]
Von Stein

[11] Patent Number: 5,886,595
[45] Date of Patent: *Mar. 23, 1999

[54] ODD ORDER MESFET FREQUENCY MULTIPLIER

[75] Inventor: Ofira M. Von Stein, Seminole, Fla.

[73] Assignee: Raytheon Company, Lexington, Mass.

[21] Appl. No.: 845,074

[22] Filed: Apr. 21, 1997

Related U.S. Application Data

[60] Provisional application No. 60/016,616 May 1, 1996.
[51] Int. Cl.[6] .............................. H01P 1/20; H03H 11/04
[52] U.S. Cl. .............................. 333/218; 327/123; 333/33
[58] Field of Search ............................ 333/218; 330/306; 363/163; 327/119, 123

[56] References Cited

U.S. PATENT DOCUMENTS

| | | | |
|---|---|---|---|
| 3,402,340 | 9/1968 | Ringereide | 333/218 |
| 5,146,178 | 9/1992 | Nojima et al. | 330/306 X |

FOREIGN PATENT DOCUMENTS

| | | | |
|---|---|---|---|
| 62-247608 | 10/1987 | Japan | 333/218 |

*Primary Examiner*—Paul Gensler
*Attorney, Agent, or Firm*—Baker & Botts, L.L.P.

[57] ABSTRACT

An odd order MESFET frequency multiplier which outputs a desired odd harmonic of a fundamental tone. The frequency multiplier includes a multiplier stage with a MESFET having a harmonic response dependent upon a plurality of bias conditions and the input RF power level. The MESFET includes a drain port coupled to an output matching network sized and configured for a predetermined load at a selected output frequency. The output matching network includes RF shorts for reflecting energy to the MESFET from a plurality of undesired even harmonics. Coupled to the output matching circuit is a bandpass filter sized and configured for the predetermined load. The bandpass filter includes RF shorts for reflecting energy to the MESFET from a plurality of undesired odd harmonics, wherein the reflected energy from the undesired even harmonics and the undesired odd harmonics are combined at the MESFET to provide additional energy at the desired odd harmonic.

19 Claims, 7 Drawing Sheets

S11: A11–SIMULATED
B11–MEASURED

| 2.0 GHz | freq | 18.0 GHzA |
| 2.0E+09 | FREQ | 18.0E+09B |

S22: A12–SIMULATED
B12–MEASURED

| 2.0 GHz | freq | 18.0 GHzA |
| 2.0E+09 | FREQ | 18.0E+09B |

SIMULATED SPECTRUM RESPONSE

ODD ORDER MESFET FREQUENCY MULTIPLIER

This application claims the benefit of U.S. Provisional Application No. 60/016,616 filed on May 1, 1996.

TECHNICAL FIELD

The present invention relates to a frequency multiplier and, more particularly, to an odd order MESFET frequency multiplier.

BACKGROUND OF THE INVENTION

An ever increasing demand for stable compact local oscillator sources in military and commercial communication systems established a need for frequency multipliers. The frequency multiplier with a single nonlinear MESFET (metal-semiconductor field effect transistor) is an efficient, low power way of satisfying the demand. Typically, a conventional oscillator generates a submultiple signal which is input to the frequency multiplier, thereafter, the frequency multiplier outputs a desired multiple frequency or output frequency.

Currently, there are active frequency multipliers and passive frequency multipliers with input frequencies above 2 GHz. The passive frequency multipliers often use diode multiplication technology which has several disadvantages when compared to active frequency multipliers. Some of the disadvantages associated with diode multipliers includes temperature induced parasitic oscillation, high input power requirement and narrow bandwidth. Also, extensive filtering is required to suppress unwanted harmonics.

Active frequency multipliers have several advantages including low power operation, wide bandwidth, low distortion, small dimensions, and temperature stability. However, traditional "odd order" active multipliers require the use of an idler circuit to short the fundamental frequency. The idler circuit appears as a small inductance connected to the MESFET and ground. A problem with the idler circuit is that it limits the bandwidth of the frequency multiplier, thereby adversely affecting the performance of the frequency multiplier.

Accordingly there is a need for a "odd order" MESFET frequency multiplier that displays improved efficiency across a broadband with low AM-to-FM conversion noise and enhanced spurious suppression. There is also a requirement to minimize the use of an idler circuit without sacrificing performance. These and other needs are satisfied by the odd order MESFET frequency multiplier of the present invention.

SUMMARY OF THE INVENTION

The present invention is an odd order MESFET frequency multiplier having an output at a desired odd harmonic of a fundamental frequency. The frequency multiplier includes a multiplier stage with a MESFET having a harmonic response dependent upon a plurality of bias conditions and the input RF power level. The MESFET includes a drain port coupled to an output matching network sized and configured for a predetermined load at an output frequency. The output matching network further includes first RF shorts for reflecting energy to the MESFET for a plurality of undesired even harmonics. Coupled to the output matching circuit is a bandpass filter sized and configured for the predetermined load. The bandpass filter includes second RF shorts for reflecting energy to the MESFET for a plurality of undesired odd harmonics, wherein the reflected energy from the undesired even harmonics and the undesired odd harmonics are combined at the MESFET to provide additional energy for the desired odd harmonic.

According to the present invention there is provided a frequency multiplier that displays improved efficiency across a broadband with low AM-to-FM conversion noise and enhanced spurious suppression.

Further in accordance with the present invention there is provided a frequency multiplier incorporated on a microwave integrated circuit.

BRIEF DESCRIPTION OF THE DRAWINGS

A more complete understanding of the invention may be had by reference to the following Detailed Description when taken in conjunction with the accompanying Drawings wherein.

DETAILED DESCRIPTION OF THE DRAWINGS

Figure 1:
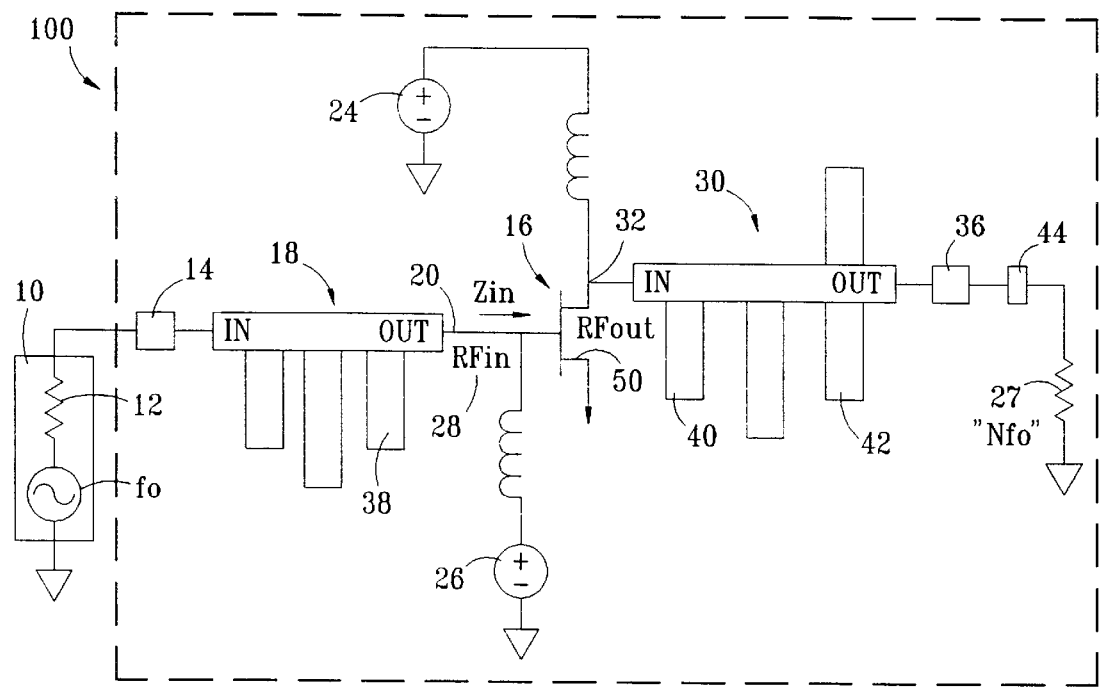
FIG. 1 is a schematic representation of an odd order MESFET frequency multiplier in accordance with the present invention.

Referring to the Drawings, wherein like numerals represent like parts throughout the several views, there is disclosed an odd order frequency multiplier 100 in accordance with the present invention.

Although the frequency multiplier will be described incorporated as a ×3 C Band frequency multiplier (first embodiment) and a ×5 X Band frequency multiplier (second embodiment), those skilled in the art will appreciate that such frequency bands are only two of many utilizing the principles of the present invention. Accordingly, the described frequency multiplier 100 may be utilized in a variety of applications such as phase lock loops, synthesizers and up/down converters, and should not be construed in a limiting manner.

Referring to FIG. 1, there is illustrated a schematic representation of an odd order MESFET frequency multiplier 100 electrically coupled to a signal source 10 generating a submultiple signal "fo" of a desired signal "nfo". The desired signal "nfo" is preferably in the microwave spectrum. An inherent source impedance of the signal source 10 is schematically illustrated by a source resistor 12. The signal source 10 is connected through source resistor 12 to an input port 14 of the frequency multiplier 100. The input port 14 is associated with an input matching network 18.

The input matching network 18 is designed to match the impedance of the source resistor 12 to an input impedance "Zin" of a MESFET 16. The input matching network 18 provides a low VSWR and maintains a substantially high gain at the desired harmonic "n" in the MESFET 16. Also, the input matching network 18 includes a plurality of input transmission lines to be described in greater detail later.

The input matching network 18 further includes a ¼ wavelength open stub 38 which is resonant at the desired harmonic "n". The open stub 38 provides an RF short for any leakage of the desired signal "nfo" at the input matching network 18.

Figure 2A:
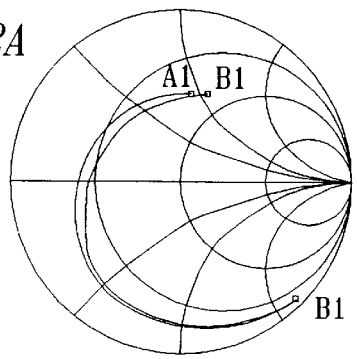
FIGS. 2A and 2B are Smith charts of measured and simulated S-Parameters for S11 (input matching network) and S22 (output matching network), respectively, of the embodiment of FIG. 1.

Referring to FIG. 2A, there is illustrated a Smith chart of simulated S11 parameters "A 11" and measured S11 parameters "B 11" developed during the design of the input matching network 18. The simulated design of the input matching network 18 includes generating a circuit file using a large signal model and generating S11 measurements under large signal conditions. Also, established during the simulated design was a S11 measured response with bias conditions using triple stub tuners to align the frequency multiplier 100. In comparison, the S11 measurements indicate that an optimum input matching network 18 corresponds to a conjugate match of the simulated S11 parameters under large signal conditions.

Referring again to FIG. 1, the frequency multiplier 100 is built around an active element, preferably the GaAs MESFET (metal-semiconductor field effect transistor) 16. The MESFET 16 includes a gate port 20 connected to the input matching network 18. Biasing of the MESFET 16 to support harmonic generation is accomplished during two conditions: (1) where Vgs=0 (voltage across the gate port 20 and source port 50 is zero) and the submultiple signal "fo" drives a gate diode of the MESFET 16 into forward conduction; and (2) at Ids=0 (current between the drain port 32 and the source port 50 is zero) or Pinch-Off Voltage such that gate voltage drops below pinch-off to create a current clipping effect.

Characterization or design of the MESFET 16 is accomplished by developing a large signal model or aligning the physical MESFET in a laboratory. A comparison of both characterization methods results in an accurate design of the MESFET 16. The large signal model design utilizes a model GaAs MESFET-NE67383 on a Hewlett Packard MDS design platform. During characterization, the gate to source capacitance versus voltage is modeled by taking advantage of the nonlinear characteristics of the MESFET 16 which can be viewed as a diode. After characterization of the MESFET 16, simulation on the Hewlett Packard MDS design platform under optimum bias conditions including Vds (voltage across the drain port 32 and the source port 50) 24, Vgs 26 and RF input power 28 is completed to obtain the desired harmonic response.

An output matching network 30 connected to a drain port 32 of the MESFET 16 functions to enhance the desired harmonic "n" while reflecting undesired even harmonics back to the MESFET 16. The output matching network 30 is configured to have an impedance termination of the undesired even harmonics that is as reflective as possible while maintaining a predetermined load 27 at the desired output frequency or signal "nfo".

The output matching network 30 includes a plurality of output transmission lines to be described in greater detail later. Also, the output matching network 30 includes a pair of ¼ wavelength open stubs 40 and 42 to provide an RF short for a fourth harmonic and a sixth harmonic. Other open stubs at various even harmonics may be provided as RF shorts if necessary.

Figure 2B:
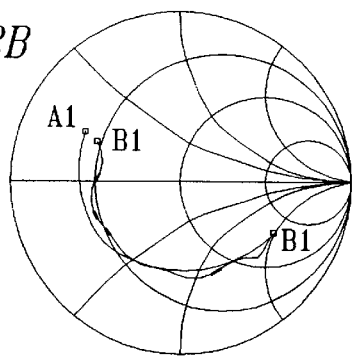
Figure 3:
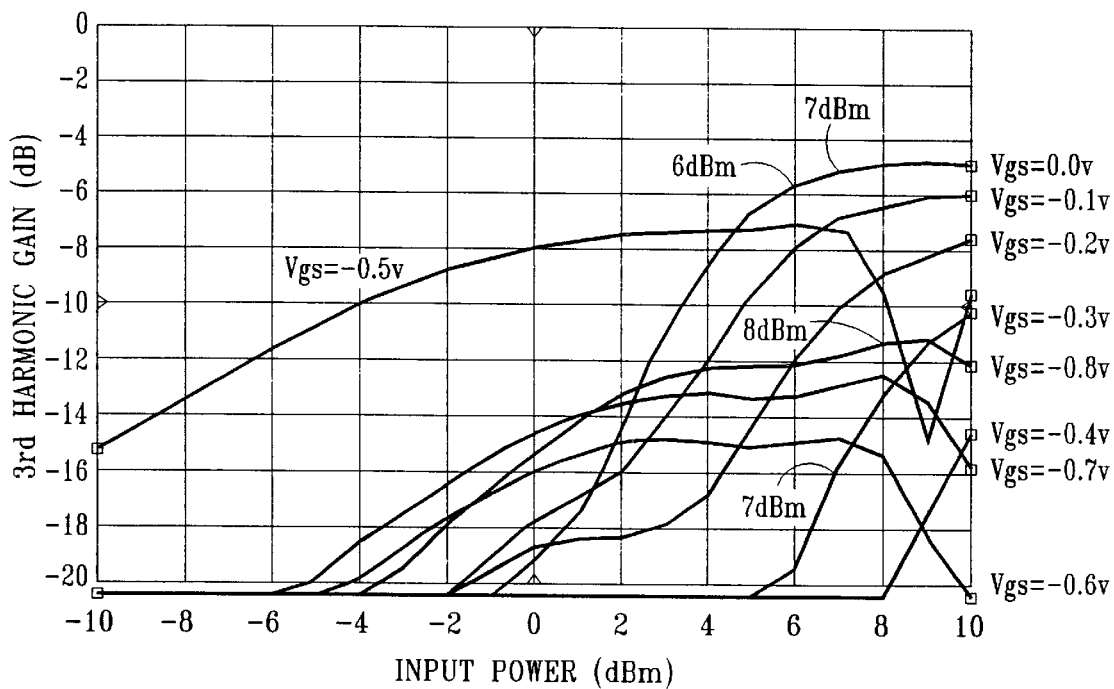
FIG. 3 is a graph indicating the dependency of a harmonic response of a MESFET on bias conditions and input RF power.

Referring to FIG. 2B, there is illustrated a Smith chart of simulated S22 parameters "A12" and measured S22 parameters "B12" developed during the design of the output matching network 30. The design of the output matching network 30 includes generating a second circuit file using a large signal model and generating S22 measurements under large signal conditions. In order to maintain the frequency multiplier 100 under large signal conditions and to measure the output impedances of the harmonics required developing a design test. For the test the MESFET 16 is biased and a large signal drive applied to the input port 14 while a small RF signal (not shown) at a small offset frequency was injected at an output port 44. A reflected signal was measured by an ideal detector and the reflection sense available on the Hewlett Packard MDS. The reason large signal analysis is required to simulate S22 can be determined by referring to FIG. 3, where there is illustrated a graph indicating that a harmonic response of the MESFET 16 is dependent on bias conditions and input RF power 28.

Also, established was a measured S22 response during bias conditions using triple stub tuners to align the frequency multiplier 100. In comparison, the measured S22 response indicates that an optimum output matching network 30 corresponds to a conjugate match of the simulated S22 parameters under large signal conditions.

Referring again to FIG. 1, since the fundamental tone or submultiple signal "fo" could not be eliminated by an RF short on the matching network 30 for the odd order frequency multiplier 100 a band pass filter 36 is connected to an output of the matching network 30. The bandpass filter 36 and output matching network 30 are designed for a predetermined load 27 (e.g. 50Ω) at the output frequency or desired signal "nfo". The combination of the output matching network 30 and the bandpass filter 36 have a phase mismatch function to reflect and recover energy contained in the submultiple signal "fo" and other undesired odd harmonics and undesired even harmonics. The reflected and recovered energy from undesired harmonics are collected at the MESFET 16 where the harmonics multiply and mix with one another to produce more power at the desired harmonic "nfo".

Upon completion of the design of the MESFET 16, the input matching network 18, and the output matching network 30 the frequency multiplier 100 is implemented on a substrate by utilizing microwave integrated circuit (MIC) or monolithic microwave integrated circuit (MMIC) technologies.

Figure 4:
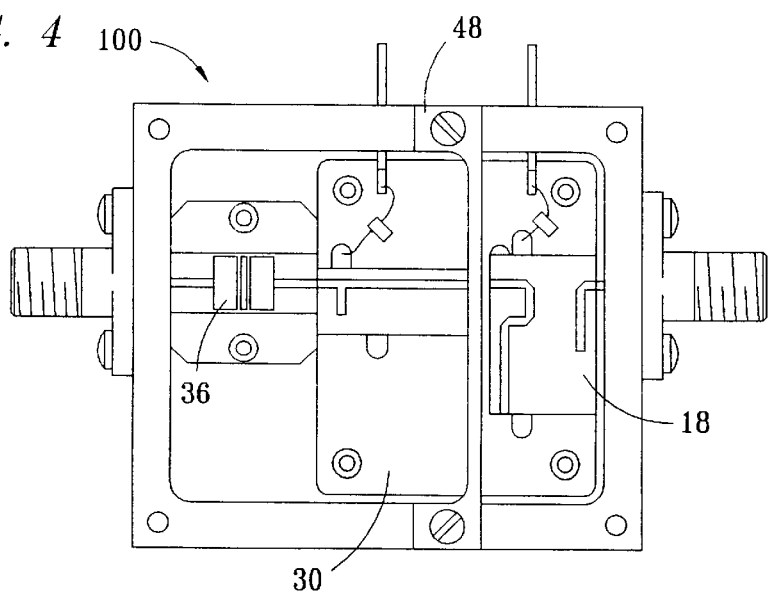
FIG. 4 is a plan view of an implementation of a first embodiment of the odd order MESFET frequency multiplier of FIG. 1 incorporated on a microwave integrated circuit.

Referring to FIG. 4, there is illustrated a plan view of a first embodiment of the odd order MESFET frequency multiplier 100. The first embodiment is a ×3 C Band active multiplier having an input frequency of 2 GHz. The active frequency multiplier 100 includes the input matching network 18, output matching network 30 and the bandpass filter 36 which are illustrated to indicate their respective artwork configurations. The bandpass filter 36 incorporated in the first embodiment is preferably a distributed interdigital coupled microstrip filter. The artwork configuration of the components is illustrated for the frequency multiplier 100 incorporated on a microwave integrated circuit. The MESFET 16 is not visible, because, it is located directly below an isolation bar 48.

The ×3 C Band active frequency multiplier 100 of the first embodiment has the following typical characteristics:

| | |
|---|---|
| Input Center Frequency: | 2 GHz |
| Output Center Frequency: | 6 GHZ |
| 1 dB % Bandwidth: | 17% |
| Input Power: | +6 dBm |
| Output Power: | +2.44 dBm |
| Conversion Gain: | −3.56 dB |
| Bias Condition: | @ Id = Idss (Vgs = 0) |
| Unwanted Harmonic Rejection: | 30 dBc Min. |

Figure 5:
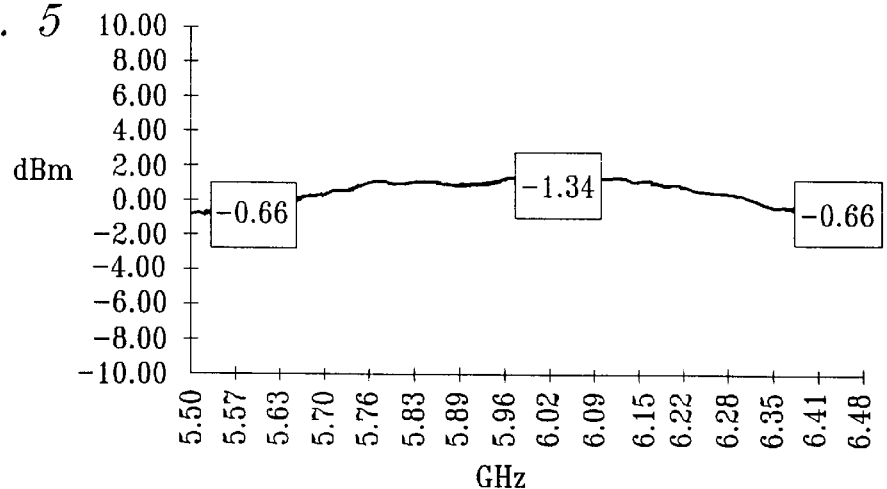
FIG. 5 is a graph of broadband response of the first embodiment of FIG. 4.

Referring to FIG. 5, there is a graph of a broadband response associated with the frequency multiplier 100 of the first embodiment illustrated in FIG. 4.

Figure 6A:
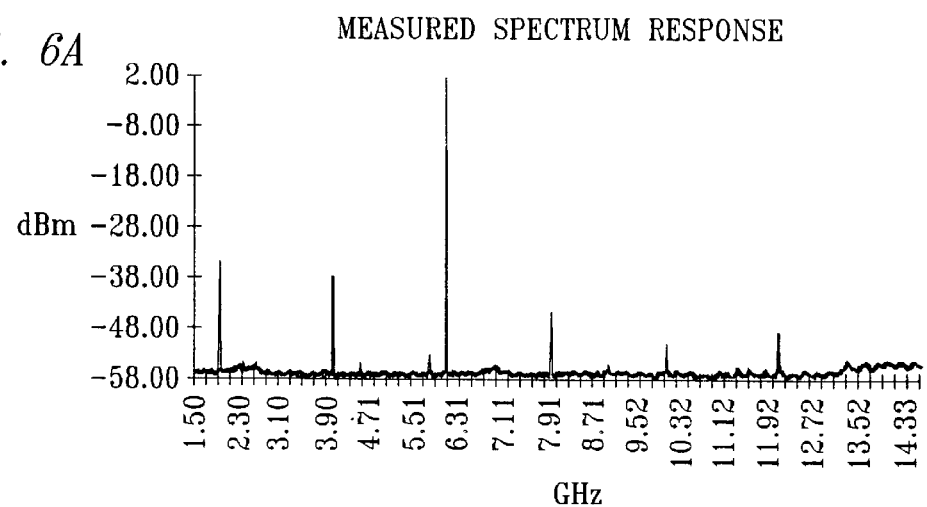
FIGS. 6A and 6B are graphs of a measured spectrum response and simulated spectrum response associated with the first embodiment of FIG. 4.
Figure 6B:
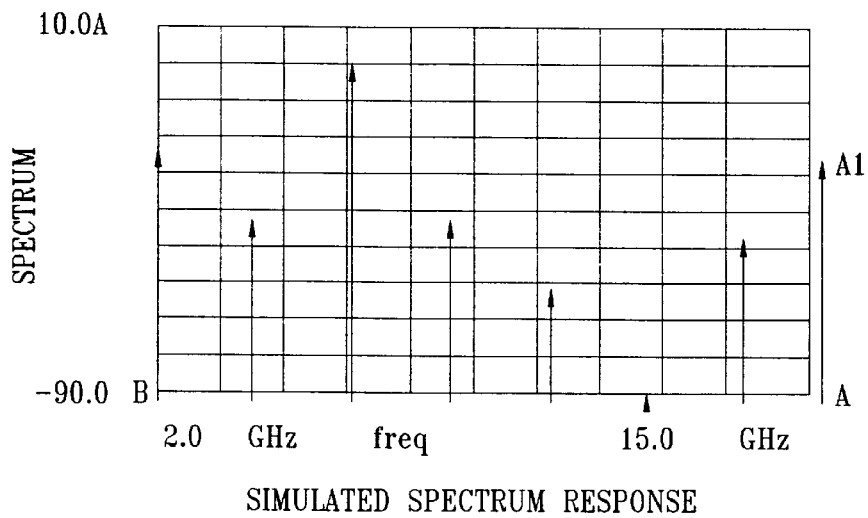

Referring to FIGS. 6A and 6B, there are illustrated graphs of a measured spectrum response and simulated spectrum response that are associated with the first embodiment.

Figure 7:
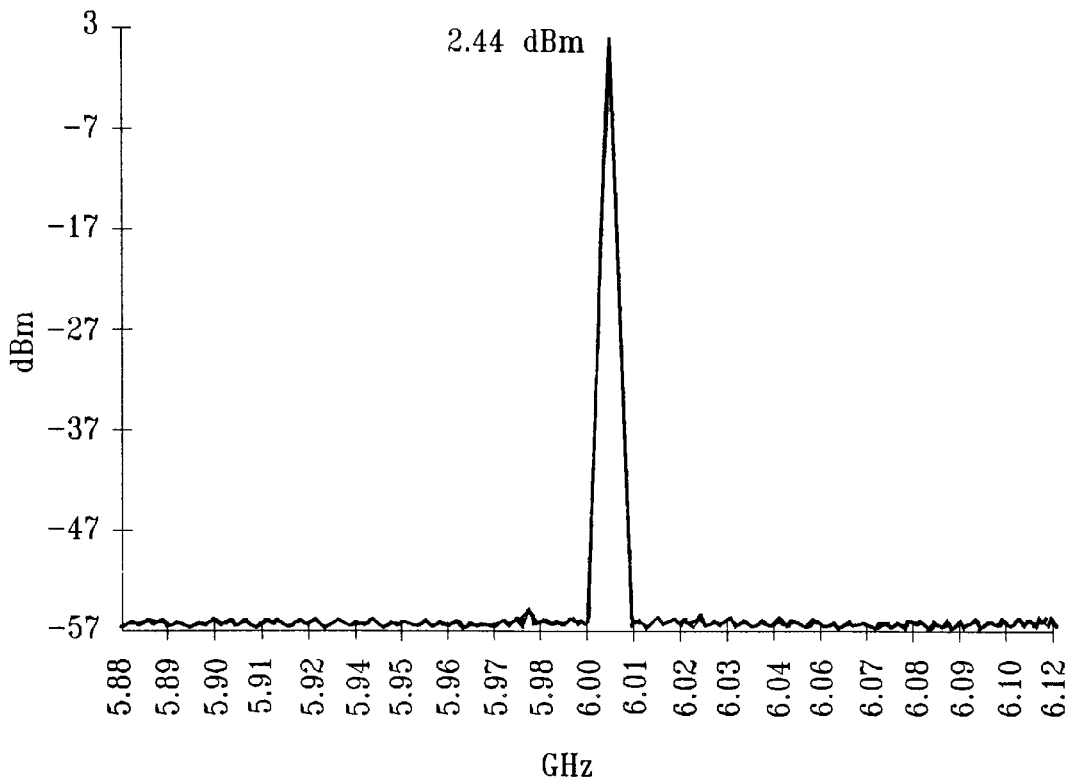
FIG. 7 is a graph of an output response of the first embodiment of FIG. 4.

Referring to FIG. 7, there is illustrated a graph of an output response of the frequency multiplier 100 of the first embodiment. The graph was generated using bias conditions of Vds equal to 3 volts and the filter loss approximately 0.92 dB.

Figure 8:
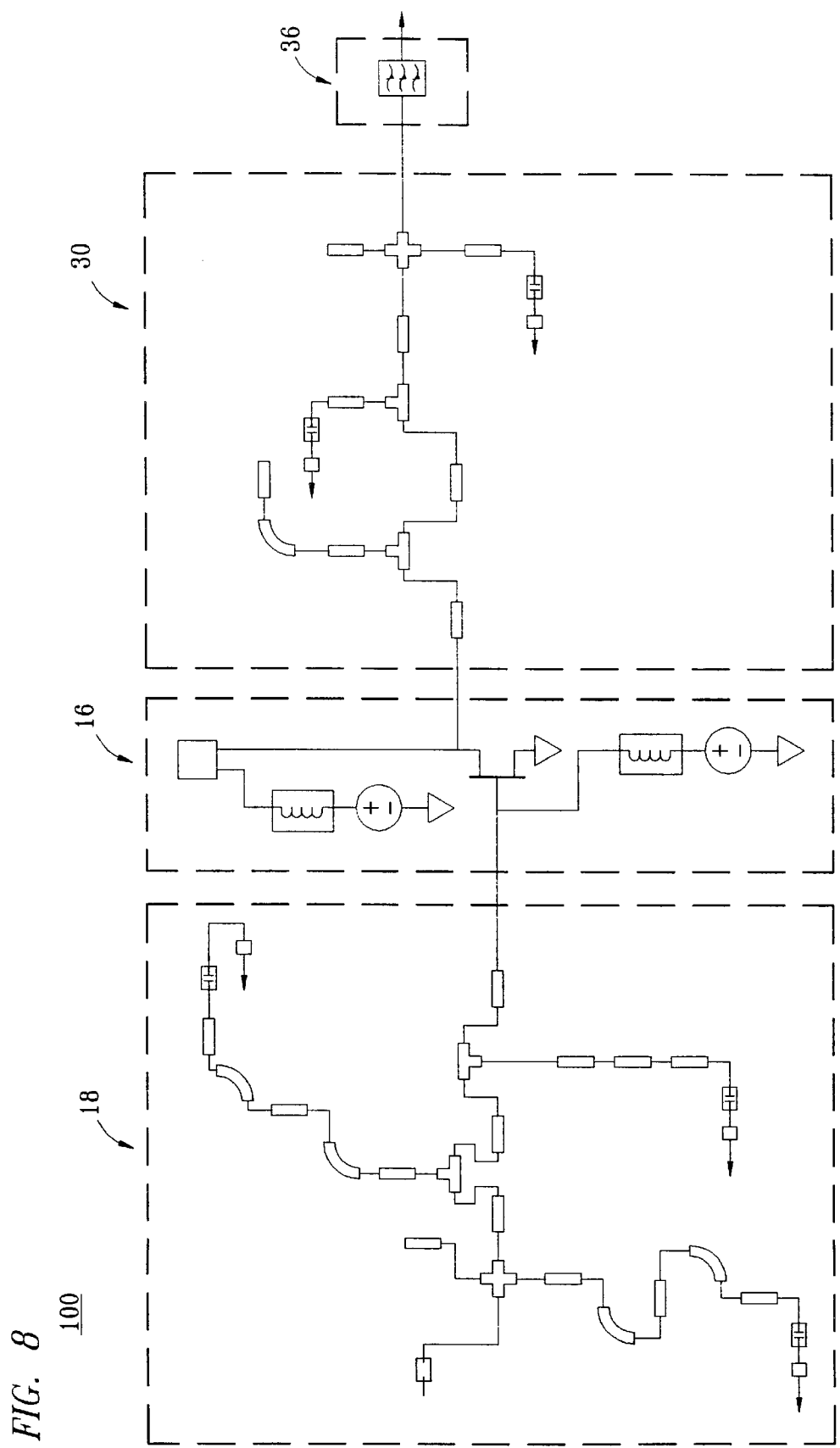
FIG. 8 is a schematic of the first embodiment of FIG. 4 illustrating transmission lines of the input and output matching networks.

Referring to FIG. 8, there is illustrated a schematic of the first embodiment of FIG. 4. The schematic illustrates the network topology that includes the input matching network 18, MESFET 16, the output matching network 30, and the bandpass filter 36. The network topology is representative of the preferred embodiment operating in the ×3 C Band, other network configurations are permissible depending upon the application.

Figure 9:
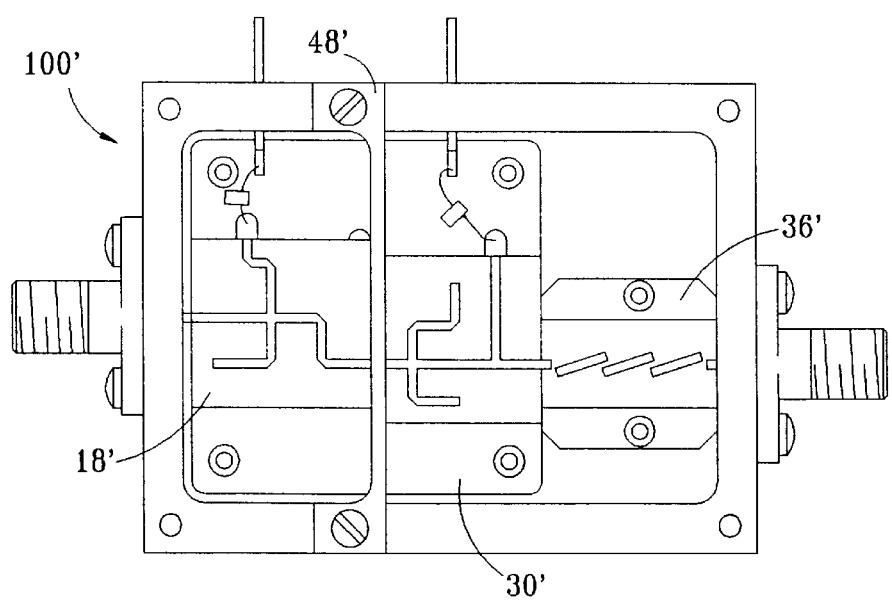
FIG. 9 is a plan view of a second embodiment of the odd order MESFET frequency multiplier of FIG. 1 incorporated on a microwave integrated circuit.

Referring to FIG. 9, there is a plan view of a second embodiment of the frequency multiplier 100 illustrated using prime reference numbers. The second embodiment is a ×5 X Band active multiplier having an input frequency of 2 GHz. The active frequency multiplier 100' includes the input matching network 18', the output matching network 3', and the bandpass filter 36' each illustrated by respective artwork configurations. The artwork configurations are apparent when the frequency multiplier 100' is incorporated on a microwave integrated circuit. The bandpass filter 36' incorporated in the second embodiment is preferably a parallel coupled microstrip filter. The MESFET 16' is not visible, because, it is located directly below an isolation bar 48'.

The ×5 X Band active frequency multiplier 100 of the second embodiment has the following typical characteristics:

| | |
|---|---|
| Input Center Frequency: | 2 GHz |
| Output Center Frequency: | 10 GHz |
| Input Power: | +12 dBm |
| Output Power: | +5.86 dBm |
| Conversion Gain: | −6.14 dB |
| Bias Condition: | @ Pinch-Off Voltage (Id = 0) |
| Unwanted Harmonic Rejection: | 30 dBc Min. |

Figure 10:
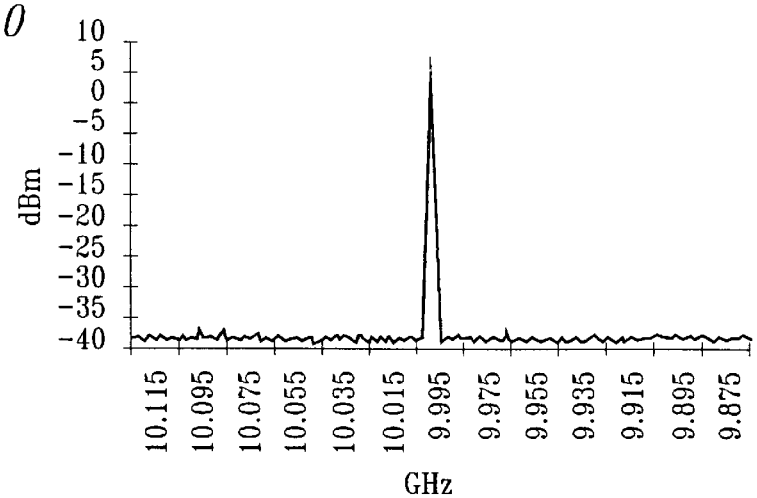
FIG. 10 is a graph of an output response of the second embodiment of FIG. 9.

Referring to FIG. 10, there is illustrated a graph of an output response of the frequency multiplier 100 of the second embodiment.

Figure 11:
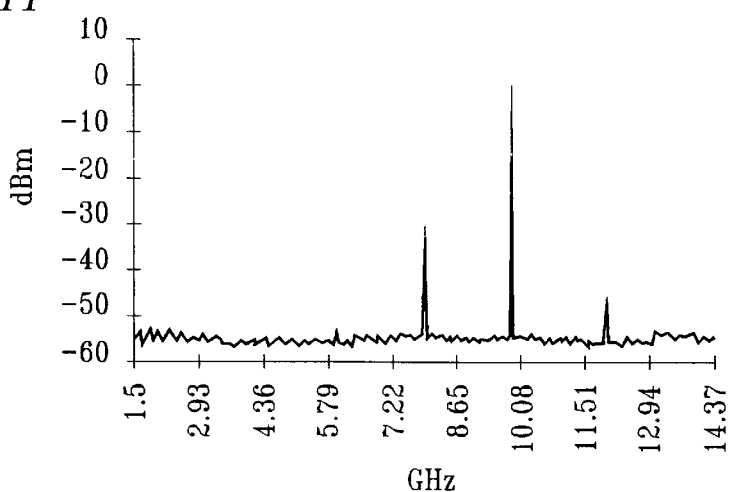
FIG. 11 is a graph of a spectrum response of the second embodiment of FIG. 9.

Referring to FIG. 11, there is illustrated a graph of a spectrum response of the frequency multiplier 100' of the second embodiment.

Figure 12A:
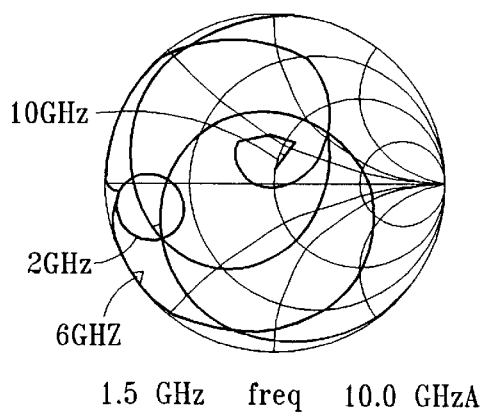
FIGS. 12A and 12B are Smith charts indicating output impedances of the second embodiment prior to and after adding a bandpass filter.
Figure 12B:
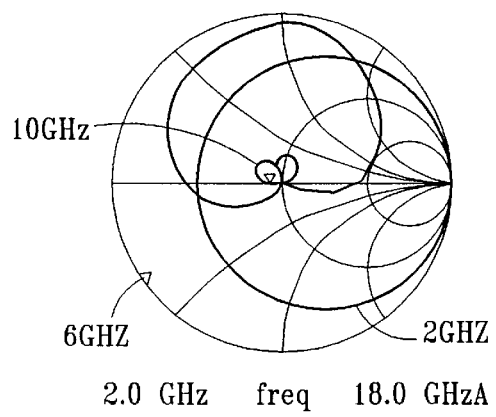

Referring to FIGS. 12A and 12B, Smith charts are illustrated indicating output impedances of the second embodiment prior to adding the bandpass filter 36' (see FIG. 12A) and the output impedances of the bandpass filter 36' displaying a reflective load at the listed undesired frequencies (see FIG. 12B). The reflection coefficients at 2 Ghz (fundamental tone "fo"), 6 GHz (undesired even harmonic) and 10 GHz (desired signal "nfo") are listed in the Table 2, below.

TABLE 2

| FREQUENCY | FIGURE 12A (w/o filter) | FIGURE 12B (input of filter) |
|---|---|---|
| 2 GHz | 0.11068 − j0.18170 | 156.98E − 09 − j2.2917 |
| 6 GHz | 0.0017611 − j0.30360 | 10.773E − 06 − j0.21422 |
| 10 GHz | 1.0363 + j0.18271 | 0.88910 + j0.0016731 |

As illustrated at 2 GHz, the fundamental tone "fo" is reflected back to the MESFET 16' and combined to provide additional energy for the desired odd harmonic "n".

Figure 13:
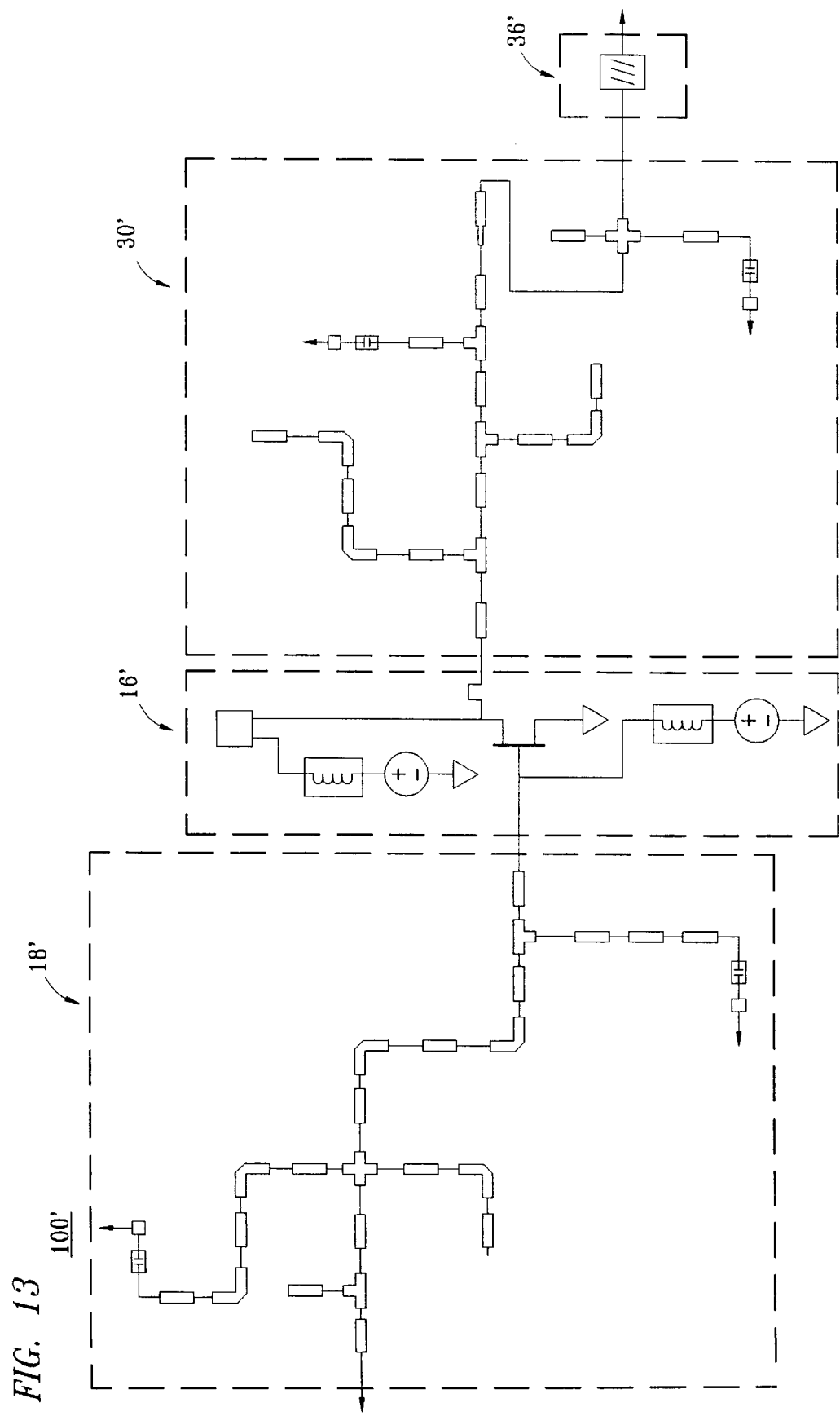
FIG. 13 is a schematic of the second embodiment of FIG. 9 illustrating transmission lines of the input and output matching networks.

Referring to FIG. 13, there is illustrated a schematic of the second embodiment of FIG. 9. The schematic illustrates the network topology that includes the input matching network 18', MESFET 16', the output matching network 30' and the bandpass filter 36'. The network topology is representative of the preferred embodiment operating in the ×5 X Band, other network configurations are permissible depending upon the application.

While the present invention has been described with reference to the illustrated embodiments, it is not intended to limit the invention but, on the contrary, it is intended to cover such alternatives, modifications and equivalents as may be included in the spirit and scope of the invention as defined in the following claims.

We claim:

1. An odd order MESFET frequency multiplier operating at an output frequency having a selected odd harmonic comprising:

an input port;

a MESFET having a harmonic response varying with applied bias condition and an input RF power level, said MESFET coupled to said input port and including a drain port;

an output matching network coupled to drain port and configured for a predetermined load at a selected output fequency, said output matching network including a first impedance and a plurality of RF shorts for reflecting energy from selected even harmonics to the MESFET; and a bandpass filter coupled to the output matching network, said bandpass filter configured for the predetermined load and including a second impedance for reflecting energy from selected odd harmonics to the MESFET, wherein the reflected energy from the selected even and odd combine at the MESFET to produce increased energy at the selected odd harmonic.

2. The frequency multiplier in accordance with claim 1 wherein the MESFET includes a gate port, and the frequency multiplier further comprises an input matching network coupled to the input port and to the gate port of the MESFET, said input matching network includes a third impedance for maintaining an impedance match and substantially high gain for the MESFET at the selected odd harmonic.

3. The frequency multiplier in accordance with claim 2 wherein the input matching network further includes a one-quarter wavelength input open stub at the output frequency, the input open stub providing a RF short for leakage at the selected odd harmonic of the output frequency at an input of the input matching circuit.

4. The frequency multiplier in accordance with claim 3 wherein said input matching network and said output matching network each include a plurality of transmission lines.

5. The frequency multiplier in accordance with claim 1 wherein the MESFET includes a gate port and further including a voltage coupled to the gate port to establish the bias conditions of the MESFET to support harmonic generation at pinch-off voltage and when the voltage measured across the gate port and the drain port equals substantially zero.

6. The frequency multiplier in accordance with claim 1 wherein the first impedance for reflecting energy to the MESFET includes a plurality of fourth harmonic and sixth harmonic one-quarter wavelength output open stubs.

7. The frequency multiplier in accordance with claim 1 wherein the bandpass filter includes a parallel coupled microstrip filter configuration for a frequency multiplier having a x5 X-band frequency multiplier configuration.

8. The frequency multiplier in accordance with claim 1 wherein the bandpass filter includes a distributed interdigital coupled microstrip filter configuration for a frequency multiplier having a x3 C-band frequency multiplier configuration.

9. An odd order MESFET frequency multiplier generating an output frequency at a selected odd harmonic, comprising:
  an input port;
  an active MESFET having a harmonic response varying with applied bias conditions and an input RF power level, said MESFET coupled to said input port and including a drain port;
  an output network coupled to a drain port of the MESFET for impedance matching at a predetermined load, said output network including a plurality of RF shorts for reflecting even harmonics to said MESFET with the plurality of RF shorts; and plurality of RF shorts; and
  a bandpass filter coupled to the output network for increasing output power at the selected odd harmonic, said filter having a phase mismatch for maximum reflection of energy from odd harmonics, wherein the odd harmonics and the even harmonics combine at the MESFET to produce increased power at the selected odd harmonics.

10. The frequency multiplier in accordance with claim 9 wherein the MESFET includes a gate port, and wherein the frequency multiplier further comprises an input network coupled to the gate port for maintaining an impedance match to produce enhanced gain at the selected odd harmonic, said input network including a plurality of input transmission lines.

11. The frequency multiplier in accordance with claim 10 wherein the input network further includes a one-quarter wavelength open stub at the desired odd harmonic.

12. the frequency multiplier in accordance with claim 9 wherein said MESFET includes a gate port and further including a voltage coupled to the gate port to establish the bias conditions of the MESFET to support harmonic generation at pinch-off voltage when the voltage measured across the gate port and the drain port equals substantially zero.

13. The frequency multiplier in accordance with claim 9 wherein said output network for reflecting even harmonics further includes a plurality of fourth harmonic and sixth harmonic one-quarter wavelength output open stubs.

14. The frequency multiplier in accordance with claim 9 wherein the bandpass filter includes a parallel coupled microstrip filter configuration for a frequency multiplier having a x5 X-band frequency multiplier configuration.

15. The frequency multiplier in accordance with claim 9 wherein the bandpass filter includes a distributed interdigital coupled microstrip filter for a frequency multiplier having a x3 C-band frequency multiplier configuration.

16. A method for generating an output frequency at a selected odd harmonic, comprising the steps of:
  injecting a submultiple of a selected signal into an input impedance matching network;
  coupling an RF short to the impedance matching network for each of the selected signals;
  biasing a MESFET having a gate port coupled to the input impedance matching network to support harmonic generation;
  reflecting energy from even harmonics to a drain port of the MESFET; and
  reflecting energy from odd harmonics to the drain port of the MESFET, wherein the reflected energy from the even harmonics and the odd harmonics multiply and mix at the MESFET to produce increased energy at the selected odd harmonic.

17. The method for generating an output frequency at a selected odd harmonic as set forth in claim 16 wherein the step of biasing a MESFET includes the step of:
  coupling a voltage to the gate port of the MESFET to establish bias conditions to support harmonic generation at pinch-off voltage when the voltage measured across the gate port and the drain port equals substantially zero.

18. The method for generating an output frequency at a selected odd harmonic as set forth in claim 17 wherein the step of biasing a MESFET includes the step of:
  coupling a voltage to the drain port of the MESFET to optimize bias conditions.

19. A method for generating an output frequency at a selected odd harmonic as set forth in claim 16 wherein the step of reflecting energy from even harmonics includes the step of:
  providing an RF short for the fourth harmonic and sixth harmonic of the selected signal.

* * * * *

UNITED STATES PATENT AND TRADEMARK OFFICE
CERTIFICATE OF CORRECTION

PATENT NO.   : 5,886,595          Page 1 of 1
DATED        : March 23, 1999
INVENTOR(S)  : Ofita M. Von Stein It is certified that error appears in the above-identified patent and that said Letters Patent is hereby corrected as shown below:

Column 6;
Line 56, after "bias", delete "condition" and insert -- conditions --.

Column 7;
Line 47, after "to", delete "said" and insert -- the --.
Line 48, delete "including" and insert -- having --.
Line 52, after "harmonics", insert -- energy --.
Line 53, after the first occurrence of "shorts", delete "and plurality of RF shorts".

Signed and Sealed this

Twenty-eighth Day of August, 2001

*Attest:*

NICHOLAS P. GODICI
*Attesting Officer*     *Acting Director of the United States Patent and Trademark Office*